(12) United States Patent
Shahbazi et al.

(10) Patent No.: US 9,986,650 B2
(45) Date of Patent: May 29, 2018

(54) SOLDERABLE CONDUCTIVE POLYMER THICK FILM COMPOSITION

(71) Applicant: Heraeus Precious Metals North America Conshohocken LLC, West Conshohocken, PA (US)

(72) Inventors: Samson Shahbazi, Roslyn, PA (US); Steven Grabey, Hazleton, PA (US)

(73) Assignee: Heracus Precious Metals North America Conshohocken LLC, West Conshohocken, PA (US)

( * ) Notice: Subject to any disclaimer, the term of this patent is extended or adjusted under 35 U.S.C. 154(b) by 307 days.

(21) Appl. No.: 14/528,527

(22) Filed: Oct. 30, 2014

(65) Prior Publication Data
US 2015/0257279 A1 Sep. 10, 2015

Related U.S. Application Data

(60) Provisional application No. 61/947,643, filed on Mar. 4, 2014.

(30) Foreign Application Priority Data

Mar. 11, 2014 (EP) .................................... 14000869

(51) Int. Cl.
| | |
|---|---|
| *H01B 1/22* | (2006.01) |
| *H05K 3/34* | (2006.01) |
| *B23K 35/30* | (2006.01) |
| *B23K 35/362* | (2006.01) |
| *B23K 35/36* | (2006.01) |
| *B23K 35/02* | (2006.01) |
| *B23K 1/00* | (2006.01) |
| *B23K 35/32* | (2006.01) |
| *B23K 35/365* | (2006.01) |

(52) U.S. Cl.
CPC ......... *H05K 3/3457* (2013.01); *B23K 1/0016* (2013.01); *B23K 35/025* (2013.01); *B23K 35/0244* (2013.01); *B23K 35/302* (2013.01); *B23K 35/3006* (2013.01); *B23K 35/3013* (2013.01); *B23K 35/3033* (2013.01); *B23K 35/322* (2013.01); *B23K 35/362* (2013.01); *B23K 35/365* (2013.01); *B23K 35/3613* (2013.01); *H05K 3/3478* (2013.01); *H05K 3/3489* (2013.01); *H05K 2203/041* (2013.01); *H05K 2203/0485* (2013.01); *H05K 2203/12* (2013.01); *Y10T 428/31678* (2015.04)

(58) Field of Classification Search
CPC ..................................................... H01B 1/22
USPC ............ 252/514, 513, 512; 428/457; 148/24
See application file for complete search history.

(56) References Cited

U.S. PATENT DOCUMENTS

| | | | | | |
|---|---|---|---|---|---|
| 5,068,150 | A | * | 11/1991 | Nakamura ............... | C08K 9/04 252/500 |
| 8,128,846 | B2 | * | 3/2012 | Yang ........................ | H01B 1/16 252/514 |
| 9,023,254 | B2 | * | 5/2015 | Hang ........................ | H01B 1/22 136/256 |
| 9,236,161 | B2 | * | 1/2016 | Mikeska ......... | H01L 31/022425 |
| 9,773,582 | B2 | * | 9/2017 | Iseda ........................ | H01B 1/22 |
| 9,789,546 | B2 | * | 10/2017 | Takahashi ................. | B22F 9/24 |
| 2009/0294741 | A1 | * | 12/2009 | Yang ........................ | H01B 1/16 252/514 |
| 2012/0119163 | A1 | * | 5/2012 | Dorfman .................. | C09D 5/24 252/514 |
| 2012/0305065 | A1 | * | 12/2012 | Dorfman .................. | H01B 1/22 136/256 |
| 2013/0099177 | A1 | * | 4/2013 | Rajendran ....... | H01L 31/022425 252/514 |
| 2013/0099178 | A1 | * | 4/2013 | Hang ........................ | H01B 1/22 252/514 |
| 2013/0160830 | A1 | * | 6/2013 | Ionkin ...................... | H01B 1/22 136/256 |
| 2013/0187101 | A1 | * | 7/2013 | Rajendran ........... | H01L 31/0224 252/514 |
| 2013/0224905 | A1 | * | 8/2013 | Fuge ............... | H01L 31/022425 438/98 |
| 2014/0018482 | A1 | | 1/2014 | Dorfman | |
| 2014/0048751 | A1 | | 2/2014 | Arancio et al. | |

FOREIGN PATENT DOCUMENTS

| | | |
|---|---|---|
| CN | 103201326 | 7/2013 |
| JP | S62-164757 A | 7/1987 |
| JP | 2005217148 A | 8/2005 |
| JP | 2014-503614 A | 2/2014 |
| TW | 201229160 A1 | 7/2012 |
| WO | WO-2012067705 A1 | 5/2012 |
| WO | WO-2012167075 A1 | 12/2012 |

OTHER PUBLICATIONS

Miliciam et al., "New Thermosetting/Thermosettable One Component Tandem Designed for Photovoltaic Applications," 28th European Photovoltaic Applications, Dec. 16, 2013, pp. 1894-1898.

* cited by examiner

*Primary Examiner* — Douglas J McGinty
(74) *Attorney, Agent, or Firm* — Blank Rome LLP; Charles R. Wolfe, Jr.; Cole T. Duncan

(57) ABSTRACT

A conductive polymer thick film composition suitable for lead-free soldering comprising metallic particles and an organic vehicle comprising at least one phenolic resin and a solvent is provided. A method of soldering to the conductive polymer thick film composition of the invention is also provided. An article comprising a substrate and a cured polymer film on a surface of the substrate formed of the conductive polymer thick film composition of the invention is provided.

20 Claims, 1 Drawing Sheet

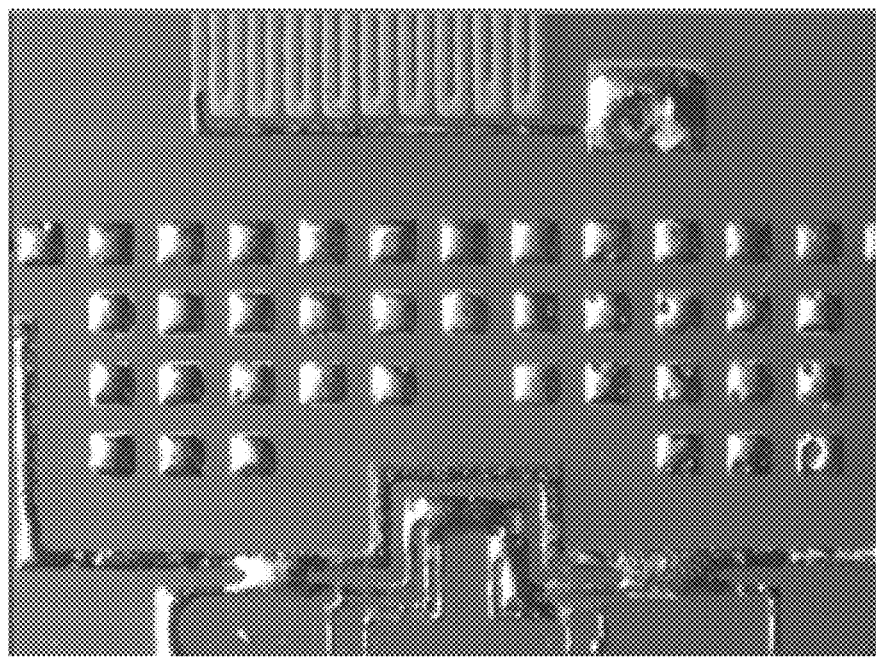
EXEMPLARY PTF COMPOSITION P14
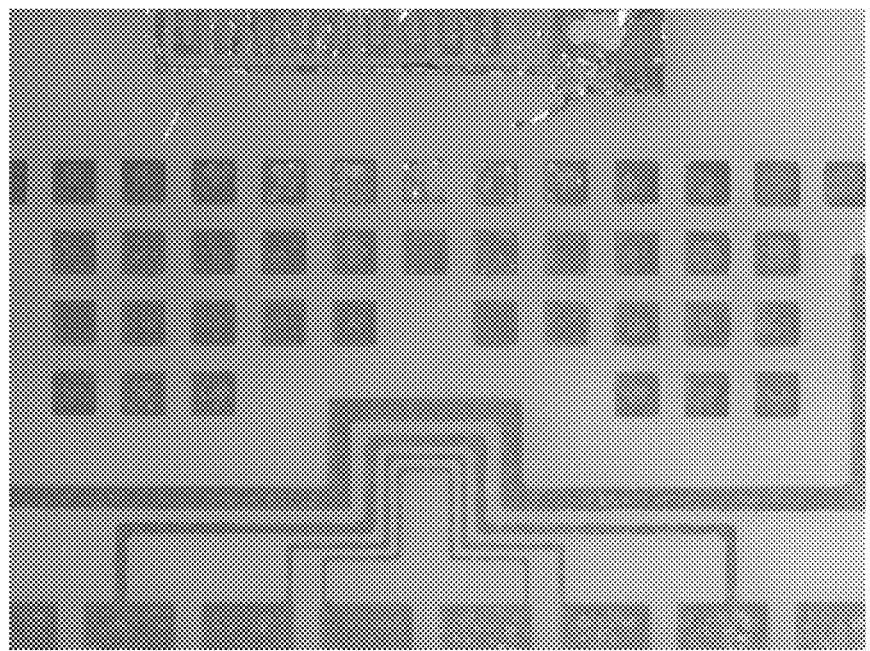
CONTROL

US 9,986,650 B2

SOLDERABLE CONDUCTIVE POLYMER THICK FILM COMPOSITION

RELATED APPLICATIONS

This application claims priority under 35 U.S.C. § 119 to U.S. Provisional Application No. 61/947,643 filed Mar. 4, 2014 and European Patent Application No. 14 000 869.9 Filed Mar. 11, 2014, the entire disclosures of which are hereby incorporated by reference.

TECHNICAL FIELD

The invention is directed to solderable conductive polymer thick film compositions. The compositions are particularly useful for low-temperature applications and are compatible with lead-free soldering techniques.

BACKGROUND

Conductive polymer thick film (PTF) compositions are becoming increasingly advantageous for use in various electronic components in a number of applications, including, but not limited to, low temperature hybrid systems. LED applications, automotive applications, power electronics, low temperature heater applications, antenna or radio frequency applications, and fuel cells. Commonly, such PTF compositions are used to form conductive layers on various substrates. Because conductive PTF compositions typically do not have a glass component (as do conventional thick film materials used in similar applications), they do not require the high firing temperatures (e.g., above 500° C.) of conventional thick film materials. Many conductive PTF compositions may be processed at temperatures between about 120° C. and 350° C. As such, the use of conductive PTF compositions reduces processing times and thus manufacturing costs associated with the manufacture of electronic circuit devices, furthermore, conductive PTF compositions may be used with a variety of substrates which require lower processing temperatures.

One concern with conductive PTF compositions is that they are difficult to solder to. Many conductive PTF compositions that are solderable use lead-based solders, which are soldered at relatively low temperatures (e.g., between about 200° C. and 270° C.) as compared to lead-free solders (e.g., between about 230° C. and 300° C.). However, lead-free solders are preferred due to environmental concerns. Because of the compositions of conductive PTF materials, their processing temperatures are lower, and thus the use of high-temperature lead-free solders is disadvantageous as leaching of the conductive component (e.g., silver) in the composition material may occur. When leaching occurs, the remaining polymer material is not solderable and leaves an unusable layer.

International Patent Publication No. WO2012/067705 teaches a polymer thick film composition solderable with lead-based solder. There is a need for a conductive PTF composition that may be directly soldered to using lead-free solder. Thus, an object of the invention is to provide a conductive PTF composition for use in low-temperature applications that is able to withstand the higher lead-free soldering temperatures.

SUMMARY

The invention provides conductive polymer thick film compositions that are able to be soldered with a lead-free solder material. The conductive polymer thick film compositions are suitable for use in a variety of low temperature electronic applications, but are also able to withstand the higher soldering temperatures associated with the use of lead-free solders.

The invention relates to a conductive polymer thick film composition suitable for lead-free soldering comprising metallic particles and an organic vehicle comprising at least one phenolic resin and a solvent.

The invention also provides a method of soldering to a conductive polymer thick film composition, comprising the steps of applying a conductive polymer thick film composition to at least one surface of a substrate, the polymer thick film composition comprising metallic particles and an organic vehicle comprising at least one phenolic resin and a solvent, curing the polymer thick film composition to form a cured film, and soldering to the exposed surface of the cured film using a lead-free solder.

The invention also provides an article comprising a substrate having at least one surface, and a cured polymer thick film applied to the at least one surface of the substrate, the cured polymer thick film formed from a conductive polymer thick film composition comprising metallic particles and an organic vehicle comprising at least one phenolic resin and a solvent. The article optionally further comprises a lead-free solder which is soldered to the cured polymer thick film.

BRIEF DESCRIPTION OF THE DRAWINGS

FIG. 1 is a photograph of an exemplary polymer thick film pattern having a metal soldered thereto according to an exemplary embodiment of the invention, as compared to a control polymer thick film pattern.

DETAILED DESCRIPTION

The invention is directed to a conductive polymer thick film (PTF) composition that is solderable using lead-free solder. Conductive PTF compositions must be sufficiently conductive so that they carry electricity between various components of the electrical assembly. Preferably, the conductive PTF composition includes an organic vehicle and a conductive material, such as metallic particles. The organic vehicle preferably includes at least one phenolic resin.

Organic Vehicle

The organic vehicle provides the medium through which the conductive component is applied to a substrate. It imparts the desired viscosity and rheology to the polymer composition, which allows the composition to be applied to a substrate via known application methods to form a variety of desired patterns. Organic vehicles used in conductive PTF compositions typically include at least one resin and at least one solvent. The organic vehicle may optionally include other additive(s) as well.

Preferred resins are those which contribute to the formation of a conductive PTF composition with favorable conductivity, printability and solderability. In a preferred embodiment, the resin is a thermosetting resin. Preferably, the resin has a curing temperature that is compatible with low-temperature substrates, such as FR4 substrates (glass-reinforced epoxy laminate). In a preferred embodiment, the resin has a curing temperature of no more than about 200° C., preferably no more than about 180° C., and most preferably no more than about 160° C.

Preferably, the organic vehicle comprises at least one phenolic resin, such as, for example. Varcum 29112 commercially available from Durez Corporation of Addison, Tex. The phenolic resin may include, but is not limited to, a resol type phenolic resin, novolac type phenolic resin, formaldehyde polymer with a phenol, and a polymer with a cresol and phenol. Without being bound by any particular theory, the phenolic resin(s) is believed to partially encapsulate the metallic particles, thereby leaving exposed areas on the metallic particles that are able to accept solder.

The resin(s) may be present in an amount of at least about 0.1 wt %, preferably at least about 0.5 wt %, and most preferably at least about 1 wt %, based upon 100% total weight of the PTF composition. At the same time, the resin(s) may be present in an amount of no more than about 40 wt %, preferably no more than about 30 wt %, and most preferably no more than about 20 wt %, based upon 100% total weight of the PTF composition. In one preferred embodiment, the PTF composition comprises about 10 wt % resin(s).

Any solvent known in the art may be used in the PTF composition. Preferred solvents include, but are not limited to, polar or non-polar, protic or aprotic, aromatic or non-aromatic compounds, and may be mono-alcohols, di-alcohols, poly-alcohols, mono-esters, di-esters, poly-esters, mono-ethers, di-ethers, poly-ethers, solvents which comprise at least one or more of these categories of functional groups, optionally comprising other categories of functional groups, preferably cyclic groups, aromatic groups, unsaturated bonds, alcohol groups with one or more O atoms replaced by heteroatoms (such as N atoms), ether groups with one or more O atoms replaced by heteroatoms (such as N atoms), esters groups with one or more O atoms replaced by heteroatoms (such as N atoms), and mixtures of two or more of the aforementioned solvents. Preferred esters in this context include, but are not limited to, di-alkyl esters of adipic acid, preferred alkyl constituents including methyl, ethyl, propyl, butyl, pentyl, hexyl and higher alkyl groups or combinations of two different such alkyl groups, preferably dimethyladipate, and mixtures of two or more adipate esters. Preferred ethers in this context include, but are not limited to, diethers, such as dialkyl ethers of ethylene glycol and mixtures of two diethers. The alkyl constituents in the dialkyl ethers of ethylene can be, for example, methyl, ethyl, propyl, butyl, pentyl, hexyl and higher alkyl groups or combinations of two different such alkyl groups. Preferred alcohols in this context include, but are not limited to, primary, secondary and tertiary alcohols, preferably tertiary alcohols, terpineol and its derivatives being preferred, or a mixture of two or more alcohols. Preferred solvents which combine more than one functional group include, but are not limited to, (i) 2,2,4-trimethyl-1,3-pentanediol monoisobutyrate, often called texanol, and its derivatives, (ii) 2-(2-ethoxyethoxy)ethanol, also known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or (iii) mixtures of at least two of the aforementioned. In a preferred embodiment, butyl carbitol acetate is used.

In one embodiment, the PTF composition comprises al least about 0.1 wt % solvent, preferably al least about 0.5 wt %, and most preferably at least about 1 wt %, based upon 100% total weight of the PTF composition. At the same lime, the solvent(s) may be present in an amount of no more than about 40 wt %, preferably no more than about 30 wt %, and most preferably no more than about 20 wt %, based upon 100% total weight of the PTF composition. In one preferred embodiment, the PTF composition comprises about 10 wt % solvent(s).

The organic vehicle may also comprise one or more additives. Preferred additives in the vehicle are those which are distinct from the aforementioned vehicle components and which contribute to favorable viscosity and rheology of the conductive PTF composition. Preferred additives include, but are not limited to, viscosity regulators, stabilizing agents, inorganic additives, thickeners, hardeners, diluents, emulsifiers, dispersants, plasticizers, pH regulators, and any combination of any of the foregoing.

According to one embodiment, the organic vehicle may comprise one or more surfactant(s) and/or thixotropic agent(s). These components contribute to the improved viscosity and printability of the conductive PTF composition. All surfactants which are known in the art, and which are considered to be suitable in the context of this invention, may be employed as the surfactant in the organic vehicle. Preferred surfactants include, but are not limited to, those based on linear chains, branched chains, aromatic chains, fluorinated chains, siloxane chains, polyether chains and combinations thereof. Preferred surfactants include, but are not limited to, single chained, double chained or poly chained. Suitable surfactants include, but are not limited to, non-ionic, anionic, cationic, amphiphilic, or zwitterionic compounds. Preferred surfactants include, but are not limited to, polymeric or monomeric or a mixture thereof. Preferred surfactants may have pigment affinic groups, preferably hydroxyfunctional carboxylic acid esters with pigment affinic groups (e.g., DISPERBYK®-108, manufactured by BYK USA. Inc.). DISPERBYK®-110 (manufactured by BYK USA. Inc.), acrylate copolymers with pigment affinic groups (e.g., DISPERBYK®-116, manufactured by BYK USA, Inc.), modified polyethers with pigment affinic groups (e.g., TEGO® DISPHRS 655, manufactured by Evonik Tego Chemie GmbH), or other surfactants with groups of high pigment affinity (e.g., TEGO® DISPERS 662 C. manufactured by Evonik Tego Chemie GmbH). Other preferred polymers include, but are not limited to, polyethylene glycol and its derivatives, and alkyl carboxylic acids and their derivatives or salts, or mixtures thereof. A preferred polyethylene glycol derivative is poly (ethylene glycol) acetic acid. Preferred alkyl carboxylic acids are those with fully saturated and those with singly or poly unsaturated alkyl chains or mixtures thereof. Preferred carboxylic acids with saturated alkyl chains are those with alkyl chain lengths in the range from about 8 to about 20 carbon atoms, preferably $C_9H_{19}COOH$ (capric acid). $C_{11}H_{23}COOH$ (lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains include, but are not limited to, $C_{18}H_{34}O_2$ (oleic acid) and $C_{18}H_{32}O_2$ (linoleic acid). A preferred monomeric surfactant is benzotriazole and its derivatives.

The surfactant may be present in an amount of at least about 0.01 wt %, based upon 100% total weight of the organic vehicle. At the same lime, the surfactant is preferably present in an amount of no more than about 10 wt %, preferably no more than about 8 wt %, and most preferably no more than about 6 wt %, based upon 100% total weight of the organic vehicle.

Thixotropic agents prevent the PTF composition from excessive spreading when deposited onto a substrate surface, which is helpful in achieving desired film thickness. Thixotropic agents also induce shear thinning behavior, which leads to improved printability. Any thixotropic agent known in the art that is compatible with the other components, including the solvent and resin components, may be used. Preferred thixotropic agents include, but are not limited to, carboxylic acid derivatives, preferably fatty acid derivatives or combinations thereof. Preferred fatty acid derivatives include, but are not limited to, saturated and unsaturated fatty acids. e.g., $C_8$ $C_{20}$ fatty acids, such as $C_9H_{19}COOH$ (capric acid), $C_{11}H_{23}COOH$ (lauric acid), $C_{13}H_{27}COOH$ (myristic acid) $C_{15}H_{31}COOH$ (palmitic acid). $C_{17}H_{32}COOH$ (stearic acid), $C_{18}H_{34}O_2$ (oleic acid), $C_{18}H_{32}O_2$ (linoleic acid) or combinations thereof. A preferred combination comprising fatty acids in this context is castor oil. Additional thixotropic agents include, but are not limited to, Thixatrol® ST, Thixatrol® PLUS, and Thixatrol® MAX (manufactured by Elementis Specialties, Inc.). In a preferred embodiment, the PTF composition includes at least one thixotropic agent, such as BYK®-410 (which contains 1-methyl-2-pyrrolidone and lithium chloride) available from BYK Additives Inc. of Austin, Tex., These components may be incorporated with the solvent and/or solvent/resin mixture, or they may be added directly into the PTF composition.

The thixotropic agent is preferably at least about 0.1 wt % of the conductive PTF composition, based upon 100% total weight of the conductive PTF composition. At the same time, the thixotropic agent is preferably no more than about 2 wt % of the conductive PTF composition, preferably no more than about 1.5 and most preferably no more than about 1 wt %, based upon 100% total weight of the conductive PTF composition.

In one embodiment, the conductive PTF composition has a viscosity sufficient to form a thick film layer on a substrate. Unless otherwise indicated, viscosity is measured using a Brookfield® Model DV-III Programmable Rheometer. Specifically, the sample is measured in a 6R utility cup using a SC4-14 spindle, and the measurement is taken after one minute at 10 RPM. According to one embodiment, the conductive PTF composition has a viscosity of at least about 10 kcPs, and preferably at least about 30 kcPs. At the same time, the polymer preferably has a viscosity of no more than about 250 kcPs, and preferably no more than about 200 kcPs.

Conductive Metallic Particles

The PTF composition further includes a conductive component. The conductive component may comprise any conductive particles known to one skilled in the art, such as, for example, conductive metallic particles. All metallic particles known in the art, and which are considered suitable in the context of the invention, may be employed as the metallic particles in the PTF composition. Preferred metallic panicles are those which exhibit high conductivity and which are solderable using lead-based and/or lead-free solders. Preferred metallic particles are elemental metals, alloys, metal derivatives, mixtures of at least two metals, mixtures of at least two alloys or mixtures of at least one metal with at least one alloy.

In one embodiment, the metallic particles include least one of silver, gold, platinum, nickel, copper, their alloys, and any combination thereof. In a preferred embodiment, the metallic particles comprise silver. Suitable silver derivatives include, for example, silver alloys and/or silver salts, such as silver halides (e.g., silver chloride), silver nitrate, silver acetate, silver trifluoroacetate, silver orthophosphate, and combinations thereof. In one embodiment, the metallic particles comprise a metal or alloy coated with one or more different metals or alloys, for example, silver particles coated with aluminum.

The metallic particles can exhibit a variety of shapes, sizes, and coating layers. A large number of shapes are known in the art. Some examples are spherical, angular, elongated (rod or needle like) and Hat (sheet like, flakes). Metallic particles may also be present as a combination of particles of different shapes (e.g., spheres and flakes). Metallic particles with a shape, or combination of shapes, which favor improved conductivity, printability and solderability are preferred. One way to characterize such shapes without considering the surface nature of the particles is through the following parameters; length, width and thickness. In the context of the invention, the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle.

In one embodiment, metallic particles with shapes as uniform as possible are preferred (i.e. shapes in which the ratios relating the length, the width and the thickness are as close as possible to 1; preferably at least 0.7, more preferably al least 0.8, and most preferably al least 0.9, and preferably no more than about 1.5, preferably no more than about 1.3, and most preferably no more than about 1.2). Examples of preferred shapes for the metallic particles in this embodiment are spheres and cubes, or combinations thereof, or combinations of one or more thereof with other shapes. In another embodiment, metallic particles are preferred which have a shape of low uniformity, preferably with al least one of the ratios relating the dimensions of length, width and thickness being above about 1.5, more preferably above about 3 and most preferably abase about 5. Preferred shapes according to this embodiment are flake shaped, rod or needle shaped, or a combination of (lake shaped, rod or needle shaped with other shapes.

Another relevant characteristic of the metallic particles is the median particle diameter $d_{50}$. Median particle diameter $d_{50}$ is a characteristic of particles well known to the person skilled in the art. $D_{50}$ is the median diameter or the medium value of the particle size distribution. It is the value of the particle diameter al 50% in the cumulative distribution. Particle size distribution may be measured via laser diffraction, dynamic light scattering, imaging, electrophoretic light scattering, or any other method known in the art. As set forth herein, a Horiba LA-910 Laser Diffraction Particle Size Analyzer connected to a computer with a LA-910 software program is used to determine the median particle diameter of the metallic particles. The relative refractive index of the metallic particle is chosen from the LA-910 manual and entered into the software program. The test chamber is filled with deionized water to the proper fill line on the tank. The solution is then circulated by using the circulation and agitation functions in the software program. After one minute, the solution is drained. This is repealed an additional time to ensure the chamber is clean of any residual material. The chamber is then filled with deionized water for a third time and allowed to circulate and agitate for one minute. Any background particles in the solution are eliminated by using the blank function in the software. Ultrasonic agitation is then started, and the metallic particles are slowly added to the solution in the test chamber until the transmittance bars are in the proper zone in the software program. Once the transmittance is at the correct level, the laser diffraction analysis is run and the particle size distribution of the metallic component is measured and given as $d_{50}$.

It is preferred that the median particle diameter $d_{50}$ of the metallic particles is at least about 0.1 μm, and preferably at least about 0.5 μm, and most preferably at least about 2.5 μm. At the same time, the $d_{50}$ is preferably no more than about 10 μm, preferably no more than about 8 μm, more preferably no more than about 7 μm, and most preferably no more than about 5 μm.

Another way to characterize the shape and surface of a metallic particle is by its specific surface area. Specific surface area is a properly of solids equal to the total surface area of the material per unit mass, solid or bulk volume, or cross sectional area. It is defined either by surface area divided by mass (with units of $m^2/g$ or $m^2/kg$), or surface area divided by the volume (units of $m^2/m^3$ or $m^{-1}$). The lowest value for the specific surface area of a particle is embodied by a sphere with a smooth surface. The less uniform and uneven a shape is, the higher its specific surface area will be.

The specific surface area (surface area per unit mass) may be measured by the BET (Brunauer-Emmett-Teller) method, which is known in the art. Specifically, BET measurements are made in accordance with DIN ISO 9277:1995. A Monosorb Model MS-22 instrument (manufactured by Quantachrome Instruments), which operates according to the SMART method (Sorption Method with Adaptive dosing Rate), is used for the measurement. As a reference material, aluminum oxide (available from Quantachrome Instruments as surface area reference material Cat. No. 2003) is used. Samples are prepared for analysis in the built-in degas station. Flowing gas (30% $N_2$ and 70% He) sweeps away impurities, resulting in a clean surface upon which adsorption may occur. The sample can be heated to a user-selectable temperature with the supplied heating mantle. Digital temperature control and display are mounted on the instrument front panel. Alter degassing is complete, the sample cell is transferred to the analysis station. Quick connect fittings automatically seal the sample cell during transfer, and the system is then activated to commence the analysis. A dewar flask filled with coolant is manually raised, immersing the sample cell and causing adsorption. The instrument detects when adsorption is complete (2-3 minutes), automatically lowers the dewar flask, and gently heats the sample cell back to room temperature using a built-in hot-air blower. As a result, the desorbed gas signal is displayed on a digital meter and the surface area is directly presented on a front panel display. The entire measurement (adsorption and desorption) cycle typically requires less than six minutes. The technique uses a high sensitivity, thermal conductivity detector to measure the change in concentration of an adsorbate/inert carrier gas mixture as adsorption and desorption proceed. When integrated by the on-board electronics and compared to calibration, the detector provides the volume of gas adsorbed or desorbed, for the adsorptive measurement. $N_2$ 5.0 with a molecular cross-sectional area of 0.162 $nm^2$ at 77K is used for the calculation. A one-point analysis is performed and a built-in microprocessor ensures linearity and automatically computes the sample's BET surface area in $m^2/g$.

The metallic particles preferably have a specific surface area of at least about 0.01 $m^2/g$, and preferably at least about 0.2 $m^2/g$. At the same time, the specific surface area is preferably no more than about 10 $m^2/g$, more preferably no more than about 8 $m^2/g$, more preferably no more than about 6 $m^2/g$, and most preferably no more than about 5 $m^2/g$.

Yet another characteristic of the metallic particles is tap density, or the bulk density of the powder after compaction of the sample. Tap density may be measured using a JEL Stampfvolumeter STAY 2003, commercially available from J. Engelsmann A G of Ludwigshafen am Rhein, Germany. A predetermined amount of metallic particles is weighed into a 100 ml beaker. The particles are then poured into a graduated cylinder using a funnel, and the cylinder is placed on the tapping machine. Once the system is started, the unit begins compaction and automatically turns offal 3.001 cycles. The high and low volume readings are taken from the cylinder and an average is calculated. The weight (grams) of metallic particles placed in the cylinder is then divided by the average volume to determine the tap density.

In a preferred embodiment, the lap density of the metallic particles is at least about 0.5 $g/cm^3$ preferably at least about 1 $g/cm^3$, and most preferably at least about 1.5 $g/cm^3$. At the same time, the tap density is preferably no more than about 10 $g/cm^3$, preferably no more than about 7 $g/cm^3$ and most preferably no more than about 6 $g/cm^3$ In one embodiment two types of metallic particles having differing tap densities (within the above ranges) are used.

In a preferred embodiment, the conductive PTF composition includes at least one type of silver particle. A mixture of different types of silver particles is more preferred. In one preferred embodiment, the conductive PTF composition includes at least one silver powder. In another preferred embodiment, the PTF composition includes at least one silver powder and at least one silver flake. Without being bound by any particular theory, it is believed that the presence of silver powder improves the solderability of the PTF composition, while the presence of silver flake improves the conductivity of the PTF composition.

According to one embodiment, the silver powder preferably has a $d_{50}$ of at least about 2 μm and no more than about 4 μm. In a most preferred embodiment, the silver powder has a $d_{50}$ of at least 2.5 μm. Further, the silver powder preferably has a specific surface area of at least about 0.1 $m^2/g$ and no more than about 0.5 $m^2/g$. In a most preferred embodiment, the silver powder has a specific surface area of about 0.3 $m^2/g$.

With respect to the silver flake, the preferred $d_{50}$ is at least about 2 μm and no more than about 4 μm. In a most preferred embodiment, the silver flake has a $d_{50}$ of about 3.5 μm. Further, the silver flake preferably has a specific surface area of at least about 1 $m^2/g$ and no more than about 3 $m^2/g$. In a most preferred embodiment, the silver flake has a specific surface area of about 2 $m^2/g$. Without being bound by any particular theory, it is believed that the inclusion of both a silver powder and silver (lake with the above-referenced characteristics improves the solderability of the conductive PTF composition.

Additional components which contribute to favorable conductivity, printability, and solderability may also be included. For example, the metallic particles may be present with a surface coating. Any such coating known in the art, and which is considered to be suitable in the context of the invention, may be employed on the metallic particles. Preferred coatings are those coatings which promote the adhesion characteristics of the resulting conductive PTF composition. If such a coating is present, it is preferred that the coating be no more than about 10 wt %, preferably no more than about 8 wt %, and most preferably no more than about 5 wt %, based on 100% total weight of the metallic particles. In a preferred embodiment, the metallic particles include a hydrophobic coating. The hydrophobic coating may comprise, for example, a saturated or unsaturated fatty acid (e.g., $C_{12}$-$C_{24}$ fatty acid) such as stearic or oleic acid.

According to one embodiment, the conductive PTF composition comprises at least about 60 wt % metallic particles, and preferably at least about 70 wt %, based upon 100% total weight of the PTF composition. At the same time, the conductive polymer preferably comprises no more than about 95 wt % metallic particles, and preferably no more than about 90 wt %, based upon 100% total weight of the PTF composition. In a preferred embodiment, the PTF composition includes at least 75 wt % metallic particles and no more than about 85 wt % metallic particles. Where a combination of at least one silver powder and at least one silver flake is used, the PTF composition preferably includes at least about 50 wt % silver powder, and preferably at least about 60 wt %, based upon 100% total weight of the PTF composition. At the same time, the PTF composition preferable includes no more than about 90 wt % silver powder, and preferable no more than about 80 wt %. With respect to the silver flake, the PTF composition preferably includes at least about 1 wt % silver flake, and preferably at least about 3 wt %, based upon 100% total weight of the PTF composition. At the same time, the PTF composition preferably includes no more than about 30 wt % silver flake, and preferably no more than about 20 wt %.

In a preferred embodiment, the PTF composition comprises (i) at least one type of silver powder having a median particle diameter $d_{50}$ of at least 2.5 μm, the silver powder particles having a hydrophobic coating, (ii) at least one silver flake, and (iii) an organic vehicle including at least one phenolic resin.

Forming the Conductive PTF Composition

To form the conductive PTF composition, the components of the organic vehicle are combined using any method known in the art for preparing a conductive PTF composition. The method preferably results in a homogenously dispersed composition. In one embodiment, the conductive metallic particles are added to the organic vehicle and mixed according to any known method in the art, such as, for example, with a mixer, and then preferably milled, for example, passed through a three roll mill to form a dispersed uniform composition.

Soldering Methods

The conductive PTF compositions of the invention are useful for lead-free soldering techniques, but may also be used in lead-based soldering as well.

The conductive PTF compositions may be applied to at least one surface of a substrate using any known application methods, such as, for example, screen printing, stencil printing, tampon printing, dispensing from a nozzle, ink jet printing, spraying, roll to roll processing, such as, for example, gravure, off-set gravure, and any combination thereof. In a preferred embodiment, the PTF composition is applied to the substrate via screen printing or the doctor blade method. The PTF composition may be printed in one layer or multiple layers to form a conductive layer with a desired thickness. The polymer composition ma) be printed in multiple passes, whereby each layer is dried before the next layer is printed. Preferably, the cured thick film has a thickness of at least about 15 microns, preferably at least about 18 microns, and most preferably at least about 20 microns. The cured thick film thickness is dependent on the application, the substrate, and the requirements of the assembly.

Any substrate (such as a silicon substrate) known to one skilled in the art and suitable for use in any particular electronic application may be used. In one embodiment, the substrate may be formed of glass, ceramic, polymer, metal or any combination thereof. While not limited to such an embodiment, the substrate may be a glass or aluminum substrate. In another embodiment, the substrate may be formed of polyethylene terephthalate. Suitable substrates may be chosen based upon such factors as temperature restrictions or mechanical properties.

Once the conductive PTF composition is applied to the substrate, it is preferably healed so as to cure the polymer and to form a cured thick film. According to one embodiment, the PTF composition is cured at temperatures of at least about 100° C., preferably at least about 120° C. and most preferably at least about 140° C. At the same lime. the PTF composition is preferably cured at temperatures of no more than about 200° C., preferably no more than 180° C., and most preferably no more than about 160° C. The PTF composition is preferably cured for al least about 5 minutes, preferably at least about 10 minutes, and most preferably at least about 15 minutes. At the same time, the PTF composition is preferably cured for no more than about 60 minutes, preferably no more than about 50 minutes, and most preferably no more than about 40 minutes. In one preferred embodiment, the PTF composition is cured for about 30 minutes at 150° C.

An electronic component may then be directly soldered to an exposed surface of the cured thick film. Any solder material known in the art may be used as solder, including, but not limited to, tin, copper, silver, bismuth, indium, zinc, antimony, and alloys thereof. According to a preferred embodiment, a lead-free solder material is used. As used herein, the term "lead-free" generally relates to a material which contains less than about 0.5 wt % lead (e.g., less than about 0.1 wt % lead). In this way, an electronic component such as, for example, a lead, a wire, a ribbon, a sheet, or any combination thereof, may be soldered directly to the thick film layer. Other electronic components, such as, for example, a chip, a resistor, an LED assembly, a capacitor, an antenna, an electrical automotive power device, a battery, a fuel cell, or any combination thereof may be soldered to the thick film layer as well. In one embodiment, soldering is performed at temperatures of at least 230° C. and no more than about 250° C.

The adhesive performance may be measured to determine whether the electronic component (e.g., lead) is well soldered to the thick film layer. Unless indicated otherwise, the adhesive performance of the PTF layer is measured according to a standard pull force test using a Zwick Roell Z25 Testing Station machine available from Zwick GmbH & Co. KG. To prepare the test specimens, the test leads (formed of solder plated copper 60/40 tin) are first ultrasonically cleaned. The test pad (an 80 mil conductive adhesion pad) is deposited onto the test coupon. The test coupons are then placed in a fixture and inserted into the testing arm of the solder dipper. The test pads are dipped in 615 Flux, and then dipped in SAC305 solder (available from AIM Solder of Montreal. Quebec) at 230° C. for three seconds to fully coat the pad. While holding the test lead perpendicular to the 80 mil pad, solder wire is added and the solder is re-melted on the pre-timed pad using a solder iron at a temperature of about 235° C. While holding the test lead, the solder iron is removed, and once the solder re-solidifies, the lead is released. The solder joints are then cleaned using an appropriate solvent, preferably soaking the parts in the solvent for several minutes before gently cleaning joints with a soft brush.

To perform the pull force test, each lead is trimmed to about two inches and the test part is then clamped into the grip of the Zwick testing machine. Each lead is pulled perpendicularly to the substrate until it separates from the test pad. The arm movement is set at a constant speed of 400 mm/minute with a grip separation of about 1.5 inches. The force at which the lead separates from the test pad is provided as the pull force (Newtons). Typically, a pull force of about 8 Newtons or greater is preferred.

In addition, the solderability of the cured polymer thick film may also be assessed visually. In this test, cured thick film layers are first dipped in 61.5 Flux, and then dipped in a solder bath of SAC305 solder at 235° C. for about five seconds. The solderability of 40 mil pads of the conductive PTF composition is then evaluated visually, whereby good solderability is observed when the pad is completely covered in solder with little dewetting. Specifically, pads that show a shiny solder layer on top of the PTF layer exhibit good solderability, while pads that show a dull, matte gray surface experience leaching away of the metallic component, leaving an unsoldered surface.

To ensure that the PTF layer has sufficient electrical performance, a standard electrical test may also be conducted. First, the PTF composition is printed into a 100 square serpentine pattern onto a substrate. After curing, each PTF layer (electrode) is probed with an Agilient 34401A 6½ Digital Multimeter commercially available from Agilent Technologies. Inc. of Santa Clara, Calif. The multimeter provides a value for the sheet resistance of the printed serpentine layer, and the resistivity (conductivity) is the calculated value that normalized the thickness of the printed layer by its length and thickness.

The invention will now be described in conjunction with the following, non-limiting examples.

Example 1

Ten solderable PTF compositions were prepared with the materials set forth in Table 1 below. The phenolic resin in each of the compositions was Varcum 29112, commercially available from Durez Corporation of Addison, Tex., and the solvent was a commercially available butyl carbitol acetate. All amounts are provided in weight percent of the total PTF composition. Each PTF composition included either silver powder or silver flake with varying median particle diameters $d_{50}$ and specific surface areas (SSA).

tape. The tape was then removed leaving a smooth two mil thick layer of wet PTF composition. Each substrate was then cured for about 30 minutes at 150° C. in a box furnace. Once cured, each part was dipped in 615 Flux, and then dipped into a solder bath of SAC305 for five seconds at 235° C. Solderability was then evaluated visually to ensure that the silver did not leach from the surface and that the solder was accepted. Photographs of each soldered part are set forth in FIG. 1. Specifically, parts that showed a shiny solder layer on top of the PTF layer exhibited good solderability. Parts that showed a dull, matte gray surface experienced leaching away of the silver component, leaving an unsoldered surface. The level of solderability was then evaluated based upon a "+/−" scale, whereby "−" denotes poor solderability, "+" denotes average solderability. "++" denotes good solderability. The results are set forth in Table 2 below.

TABLE 2

Solderability Performance of PTF Compositions P1-P10

| | P1 | P2 | P3 | P4 | P5 | P6 | P7 | P8 | P9 | P10 |
|---|---|---|---|---|---|---|---|---|---|---|
| Solderability | ++ | + | − | − | ++ | + | + | + | − | − |

Example 2

Conductive PTF compositions were prepared with the starting materials set forth in Table 3 below. The components used were as follows: the phenolic resin and Solvent 1 were the same as used in Example 1: the polyimide resin was a mixture of 14% polyimide resin commercially available from Alfa Aesar of Ward Hill, Mass., 26% gamma butyrolactone, and 60% tetramechylene sulfone: the epoxy was Epo-Tek® H61-110 unfilled epoxy commercially available from Epoxy Technology. Inc. of Billerica, Mass.: Solvent 2 was gamma butyrolactone: the hardener was boron fluoride monoethylamine; the diluent was Erisys™ GE-21 commercially available from Emerald Performance Materials of

TABLE 1

Exemplary PTF Compositions P1-P10

| | D50 (μm) | SSA (m²/g) | P1 | P2 | P3 | P4 | P5 | P6 | P7 | P8 | P9 | P10 |
|---|---|---|---|---|---|---|---|---|---|---|---|---|
| Phenolic Resin | — | — | 10 | 10 | 10 | 10 | 10 | 10 | 10 | 10 | 10 | 10 |
| Solvent (BCA) | — | — | 10 | 10 | 10 | 10 | 10 | 10 | 10 | 10 | 10 | 10 |
| Silver Powder | 3 | 0.31 | 80 | — | — | — | — | — | — | — | — | — |
| Silver Powder | 5 | 0.16 | — | 80 | — | — | — | — | — | — | — | — |
| Silver Powder | 2.8 | 0.36 | — | — | 80 | — | — | — | — | — | — | — |
| Silver Powder | 2.8 | 0.36 | — | — | — | 80 | — | — | — | — | — | — |
| Silver Powder | 2.7 | 0.27 | — | — | — | — | 80 | — | — | — | — | — |
| Silver Flake | 3 | 1.2 | — | — | — | — | — | 80 | — | — | — | — |
| Silver Flake | — | 1.41 | — | — | — | — | — | — | 80 | — | — | — |
| Silver Flake | 2.6 | 0.61 | — | — | — | — | — | — | — | 80 | — | — |
| Silver Flake | 1 | 4.1 | — | — | — | — | — | — | — | — | 80 | — |
| Silver Flake | 2.3 | 2.44 | — | — | — | — | — | — | — | — | — | 80 |

Each PTF composition was then applied to an FR4 substrate (glass-reinforced epoxy laminate) using a doctor blade method. A two mil tape was applied to both sides of the substrate, leaving about 0.75 inches of unobstructed surface area of the FR4 substrate. A small amount of the PTF composition was added between the tape, and a blade was used to smooth the PTF composition between the pieces of Moorestown, N.J.; and the thixotrope was BYK®-410 commercially available from BYK Additives, Inc. of Austin, Tex. The control was formulated with silver flake and polyimide/epoxy resin, while all exemplary compositions were formulated with a combination of silver powder and silver flake, as well as phenolic resin. All amounts are provided in weight percent of the total PTF composition.

TABLE 3

Exemplary PTF Compositions P11-P14

|  | D50 (μm) | SSA (m²/g) | Control | P11 | P12 | P13 | P14 |
|---|---|---|---|---|---|---|---|
| Phenolic resin | — | — | — | 9.85 | 9.85 | 9.85 | 9.85 |
| Solvent # 1 | — | — | — | 9.85 | 9.85 | 9.85 | 9.85 |
| Polyimide resin | — | — | 19.8 | — | — | — | — |
| Epoxy | — | — | 4.59 | — | — | — | — |
| Silver Flake | — | 0.84 | — | 20 | — | 5 | — |
| Silver Powder | 3 | 0.31 | — | 60 | 80 | 75 | 76 |
| Silver Flake | 3.4 | 2.1 | — | — | — | — | 4 |
| Silver Flake | 3.05 | 0.7 | 75 | — | — | — | — |
| Solvent # 2 | — | — | 0.15 | — | — | — | — |
| Hardener | — | — | 0.3 | — | — | — | — |
| Diluent | — | — | 0.16 | — | — | — | — |
| Thixatrope | — | — | — | 0.3 | 0.3 | 0.3 | 0.3 |

Each of these PTF compositions was then screen printed onto an FR4 substrate using a 280 mesh screen to form 40 mil pads. The PTF layers were cured at 150° C. for about 30 minutes in a box furnace. The test samples were then prepared for visual inspection according to the parameters set forth in Example 1 above. Photographs of each soldered part are set forth in FIGS. 2 and 3. As can be seen, parts prepared with compositions P11, P12 and P14 provided soldered pads with good solder acceptance. As shown in FIG. 3. P15 exhibited almost complete leaching away of the silver component leaving an entirely unusable pad. The solderability was calculated as a percentage by dividing the number of pads with complete (or near complete) solder acceptance by the total number of pads (40). Incomplete solder acceptance can be seen in the pads which appear to have missing soldered areas or deformed areas. The results are set forth in Table 4 below.

Each of these test samples (except P15, which was left with an unusable pad) then underwent pull force testing according to the parameters set forth herein. The results of the pull force testing are set forth in Table 4 below. Exemplary FIT composition P14, with a combination of silver powder, silver flake, and a phenolic resin, exhibited the best adhesive performance and best solder acceptance.

TABLE 4

Adhesive Performance of Exemplary Conductive Polymers P11-P14

|  | P11 | P12 | P13 | P14 |
|---|---|---|---|---|
| Average Adhesion (N) | 13.7 | 14.7 | 12.9 | 44.7 |
| Stand. Deviation (N) | 4.18 | 9.65 | 7.47 | 7.16 |
| Solderability (%) | 75% | 20% | 0% | 85% |

A standard electrical test was also performed for each of the exemplars PTF compositions according to the parameters set forth herein. The results are set forth in Table 4 below. Exemplary PTF composition P14 exhibited excellent conductivity, and compositions P11 and P13 exhibited the lowest resistance.

TABLE 4

Average Electrical Performance of Exemplary PTF Compositions P11-P14

|  | P11 | P12 | P13 | P14 |
|---|---|---|---|---|
| Resistance (Ω) | 2.23 | 3.16 | 2.50 | 3.35 |
| Conductivity (mΩ/sq/mil) | 24.35 | 25.93 | 23.44 | 27.86 |

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

The invention claimed is:

1. A conductive polymer thick film composition, comprising:
   metallic particles comprising:
      50-90 wt % silver powder, the silver powder having a specific surface area of at least about 0.1 m²/g and no more than about 0.5 m²/g; and
      1-30 wt % silver flake, the silver flake having a specific surface area of at least about 1 m²/g and no more than about 3 m²/g; and
   an organic vehicle comprising at least one phenolic resin and a solvent,
   wherein the conductive polymer thick film composition is suitable for lead-free soldering, and
   wherein the wt % of the silver powder and the wt % of the silver flake are based upon the total weight of the polymer thick film composition.

2. The conductive polymer thick film composition according to claim 1, wherein the metallic particles have a median particle diameter $d_{50}$ of at least about 0.1 μm and no more than about 10 μm.

3. The conductive polymer thick film composition according to claim 1, wherein the composition comprises at least about 60 wt % metallic particles, based upon 100% total weight of the composition.

4. The conductive polymer thick film composition according to claim 1, wherein the metallic particles further comprise gold, platinum, nickel, copper, their alloys, and any combination thereof.

5. The conductive polymer thick film composition according to claim 1, wherein the silver powder has a median particle diameter $d_{50}$ of at least about 2 μm and no more than about 4 μm.

6. The conductive polymer thick film composition according to claim 1, wherein the silver flake has a median particle diameter $d_{50}$ of at least about 2 μm and no more than about 4 μm.

7. The conductive polymer thick film composition according to claim 1, wherein the composition comprises at least about 60 wt % silver powder, based upon 100% total weight of the composition.

8. The conductive polymer thick film composition according to claim 1, wherein the composition comprises at least about 3 wt % and no more than about 20 wt % silver flake, based upon 100% total weight of the composition.

9. The conductive polymer thick film composition according to claim 1, wherein the composition comprises at least about 0.1 wt % and no more than about 40 wt % phenolic resin, based upon 100% total weight of the composition.

10. The conductive polymer thick film composition according to claim 1, wherein the composition comprises at least about 0.1 wt % and no more than about 40 wt % solvent, based upon 100% total weight of the composition.

11. The conductive polymer thick film composition according to claim 1, wherein the organic vehicle further comprises a thixotropic agent.

12. A method of soldering to a conductive polymer, comprising the steps of:
applying a conductive polymer thick film composition to at least one surface of a substrate, the conductive polymer thick film composition comprising:
metallic particles comprising:
50-90 wt % silver powder, the silver powder having a specific surface area of at least about 0.1 $m^2/g$ and no more than about 0.5 $m^2/g$; and
1-30 wt % silver flake, the silver flake having a specific surface area of at least about 1 $m^2/g$ and no more than about 3 $m^2/g$, and
an organic vehicle comprising at least one phenolic resin and a solvent;
curing the polymer thick film composition to form a cured film; and
soldering to the exposed surface of the cured film using a lead-free solder,
wherein the wt % of the silver powder and the wt % of the silver flake are based upon the total weight of the polymer thick film composition.

13. The method according to claim 12, wherein the curing is performed at a temperature of at least 100° C. and no more than about 200° C.

14. The method according to claim 12, wherein the soldering is performed at a temperature of at least 230° C. and no more than about 250° C.

15. The method according to claim 12, wherein the cured film has a thickness of at least about 15 microns.

16. An article comprising:
a substrate having at least one surface; and
a cured polymer film applied to the at least one surface of the substrate, the cured polymer film formed from a conductive polymer thick film composition comprising:
metallic particles comprising:
50-90 wt % silver powder, the silver powder having a specific surface area of at least about 0.1 $m^2/g$ and no more than about 0.5 $m^2/g$; and
1-30 wt % silver flake, the silver flake having a specific surface area of at least about 1 $m^2/g$ and no more than about 3 $m^2/g$, and
an organic vehicle comprising at least one phenolic resin and a solvent,
wherein the conductive polymer thick film composition is suitable for lead-free soldering, and
wherein the wt % of the silver powder and the wt % of the silver flake are based upon the total weight of the polymer thick film composition.

17. The conductive polymer thick film composition according to claim 1, wherein the metallic particles have a median particle diameter $d_{50}$ of at least about 0.5 μm, and no more than about 5 μm.

18. The conductive polymer thick film composition according to claim 1, wherein the composition comprises at least about 1 wt % and no more than about 20 wt % phenolic resin, based upon 100% total weight of the composition.

19. The conductive polymer thick film composition according to claim 1, wherein the composition comprises at least about 70 wt % metallic particles, based upon 100% total weight of the composition.

20. The conductive polymer thick film composition according to claim 1, wherein the composition comprises at least about 1 wt % and no more than about 20 wt % solvent, based upon 100% total weight of the composition.

* * * * *